(12) United States Patent
Chey et al.

(10) Patent No.: US 6,597,550 B1
(45) Date of Patent: Jul. 22, 2003

(54) HIGH VOLTAGE INTEGRATED CIRCUIT WITH RESISTOR CONNECTED BETWEEN SUBSTRATE AND GROUND TO LIMIT CURRENT DURING NEGATIVE VOLTAGE SPIKE

(75) Inventors: Christopher C. Chey, Redondo Beach, CA (US); Marijana Vukicevic, Los Angeles, CA (US)

(73) Assignee: International Rectifier Corporation, El Segundo, CA (US)

( * ) Notice: Subject to any disclaimer, the term of this patent is extended or adjusted under 35 U.S.C. 154(b) by 158 days.

(21) Appl. No.: 09/716,263

(22) Filed: Nov. 21, 2000

Related U.S. Application Data
(60) Provisional application No. 60/167,344, filed on Nov. 24, 1999.

(51) Int. Cl.[7] .......................... H02H 9/00; H01L 29/00
(52) U.S. Cl. ........................................ 361/58; 257/536
(58) Field of Search .............................. 361/2, 3, 8, 9, 361/58; 323/274–277; 257/530–540; 327/107–110

(56) References Cited

U.S. PATENT DOCUMENTS

| | | | | |
|---|---|---|---|---|
| 4,679,170 A | * | 7/1987 | Bourassa et al. | 257/904 |
| 5,801,557 A | * | 9/1998 | Dubhashi et al. | 327/108 |

* cited by examiner

Primary Examiner—Brian Sircus
Assistant Examiner—Boris Benenson
(74) Attorney, Agent, or Firm—Ostrolenk, Faber, Gerb & Soffen, LLP

(57) ABSTRACT

A high voltage integrated circuit (HVIC) chip with a resistor connected between the substrate of the chip and ground. The resistor substantially improves the handling of negative voltage spikes by limiting the current passing through the intrinsic diode of the chip when the diode conducts due to negative transients at the output node.

3 Claims, 2 Drawing Sheets

HIGH VOLTAGE INTEGRATED CIRCUIT WITH RESISTOR CONNECTED BETWEEN SUBSTRATE AND GROUND TO LIMIT CURRENT DURING NEGATIVE VOLTAGE SPIKE

This application claims the benefit of U.S. Provisional Application No. 60/167,344, filed Nov. 24, 1999.

BACKGROUND OF THE INVENTION

1. Field of the Invention:

The present invention is directed to a circuit for protecting a high voltage integrated circuit for driving power transistors in a half bridge configuration, allowing for excessive negative swing of the output node.

2. Description of the Related Art:

In driver circuits for power transistors, for example, power MOSFETs driving power equipment, the power transistors often switch a large current. The large switching current, combined with forward recovery characteristics of diodes and stray inductance in the circuit, generates a negative spike at the output node of the half bridge. These spike signals can be destructive to the driver circuits and also create noise.

SUMMARY OF THE INVENTION

It is accordingly, an object of the present invention to provide a circuit for driving power transistors in a half bridge configuration allowing for excessive negative swing of the output node.

It is furthermore an object of the present invention to provide such a circuit which can be integrated on a single chip.

The above and other objects of the invention are achieved by providing a resistor between the substrate of the high voltage integrated circuit chip (HVIC) and ground potential (i.e., the common potential terminal (COM)) of the chip.

It has been found that including a resistor between the substrate and ground of the HVIC substantially improves the handling of negative voltage spikes by limiting the current passing through the intrinsic diode of the chip when the diode conducts due to negative transients at the output node.

Other features and advantages of the present invention will become apparent from the following description of the invention which refers to the accompanying drawings.

DETAILED DESCRIPTION OF PREFERRED EMBODIMENT

Figure 1:
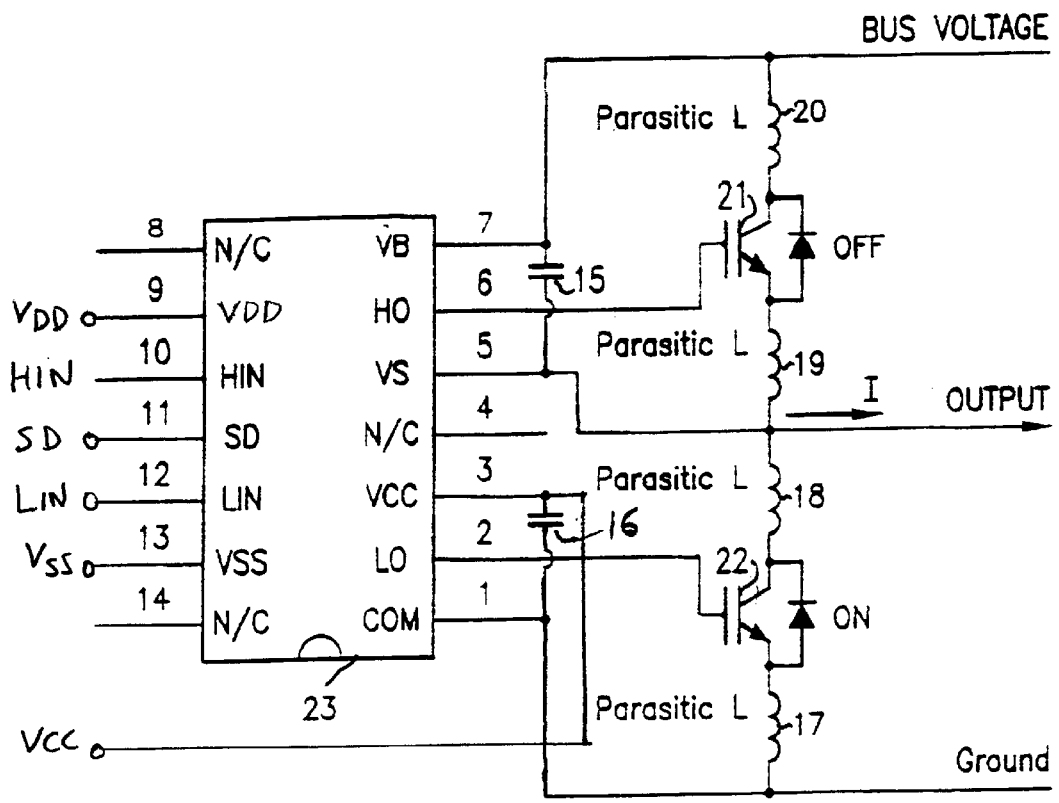
FIG. 1 is an application configuration of a High Voltage Integrated Circuit (HVIC) chip.

FIG. 1 shows a circuit of an HVIC 23 driving a half-bridge configuration which is used in various motor and appliance applications. HVIC 23 is a gate driver IC such as the IR2 110 chip driver manufactured by International Rectifier Corporation of El Segundo, Calif. The circuit has capacitors 15 and 16 that are capable of holding up supply voltages. Also shown are two MOSgated power transistor switches 21 and 22, which are high side and low side switches respectively, the gates of which are driven from the HVIC driver 23 high output pin HO and low output pin LO, identified by pins 6 and 2, respectively. Inherent parasitic inductances 17, 18, 19 and 20 are shown in the diagram.

When switch 21 turns off and switch 22 turns on, the voltage on pin 5 (Vs) drops below ground due to these parasitic (stray) inductances. This voltage can be calculated using the following formula:

$$V = L \times dI/dt.$$

Figures 2, 3:
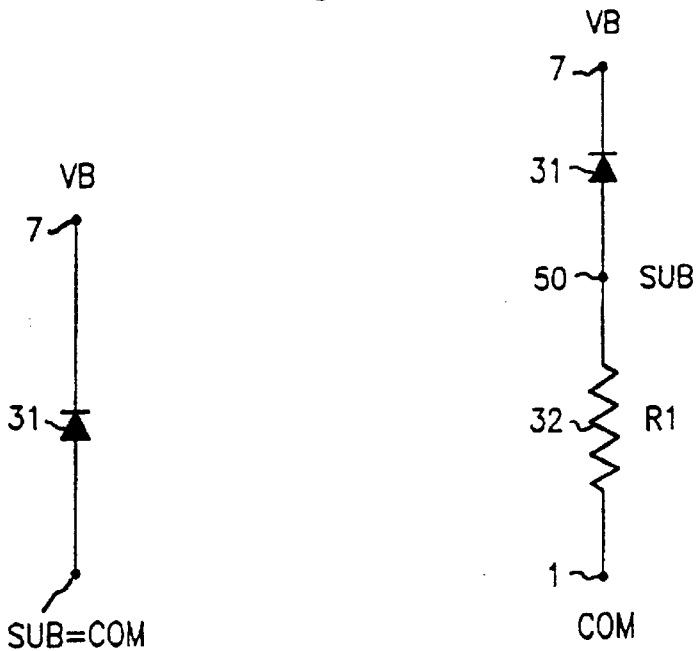
FIG. 2 shows a parasitic structure between the bus voltage and the ground interiorly of an existing HVIC chip.
FIG. 3 shows a parasitic structure between the line voltage and the substrate, and the novel resistor of the present invention between the substrate and ground in the chip of FIGS. 1 and 2.

When the voltage Vs drops below COM−(Vsupply+Vf), such as during a negative voltage spike, the internal parasitic diode 31 (see FIG. 2) within chip 23 will start to conduct; where Vsupply is the battery voltage across the capacitor 15 and Vf is the forward diode voltage. If Vs becomes too negative, excessive current can flow through the chip, resulting in chip failure. To prevent this failure, a resistor 32 is introduced in series with the diode 31 as shown in FIG. 3. The role of resistor 32 is to limit the current through the internal parasitic diode 31 during the negative voltage spike and protect the chip.

Thus, the resistor of the present invention, connected between the substrate and ground (COM), acts as a negative spike voltage protection for the High Voltage Integrated Circuit 23.

Figure 4:
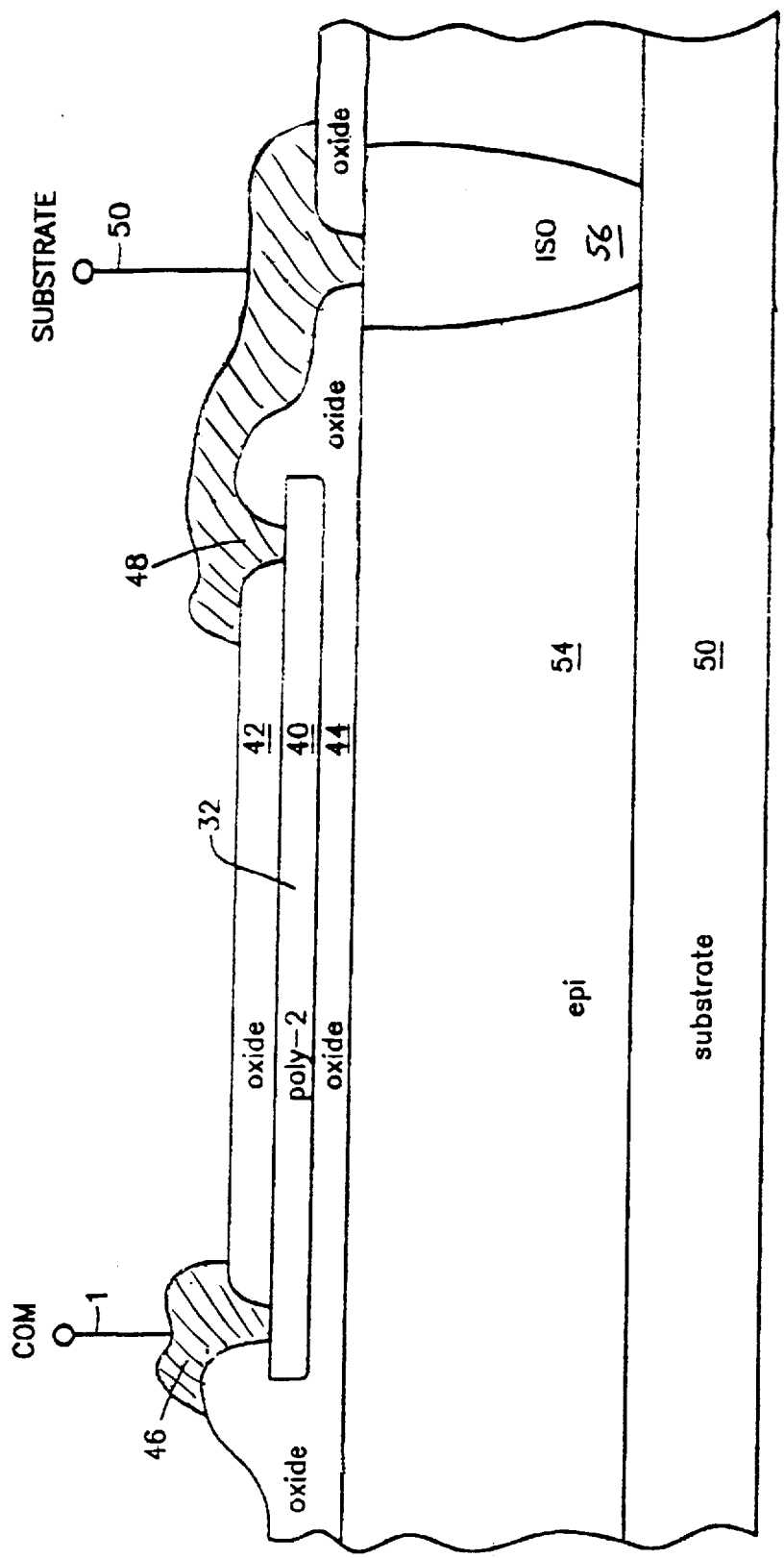
FIG. 4 is a cross-section of a portion of an HVIC chip showing a preferred implementation of the resistor of the present invention.

FIG. 4 shows a preferred implementation of the resistor of the present invention in the silicon wafer of an HVIC. The resistor 32 is implemented in a polysilicon layer 40 sandwiched between oxide layer 42 and oxide layer 44. A first side of resistor 32 has a contact opening 46 for connection to the COM (ground) node. A second side of resistor 32 has a contact opening 48 for connection to substrate 50. The connection is made through isolation (ISO) layer 56 to substrate layer 50.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

We claim:

1. A high voltage integrated circuit chip for driving first and second power transistors arranged in a halfbridge configuration which allows for excessive negative voltage swing of an output node between the transistors in the halfbridge configuration, comprising:

a voltage source connection;

a ground connection;

a substrate for the high voltage integrated circuit chip;

first and second gate drivers formed in an epitaxial layer disposed over the substrate for driving the first and second power transistors in series in the halfbridge configuration; and a resistor disposed over the epitaxial layer and electrically connected at one end thereof to the voltage source connection and at another end thereof to the ground connection and the substrate through the epitaxial layer to limit the current flowing through a parasitic diode of the high voltage integrated circuit due to negative voltage transients at the output node.

2. The high voltage integrated circuit chip of claim 1, wherein the resistor is formed of a polysilicon layer disposed between layers of oxide, with contact openings on opposite ends of the polysilicon layer for connection to the ground potential and to the substrate, respectively.

3. The high voltage integrated circuit chip of claim 1, wherein the resistor is electrically connected to the substrate through an isolation region formed in the epitaxial layer.

* * * * *